United States Patent [19]

Hsieh et al.

[11] Patent Number: 4,728,597

[45] Date of Patent: Mar. 1, 1988

[54] DESENSITIZING SOLUTION FOR LITHOGRAPHIC PRINTING PLATES

[75] Inventors: Shane Hsieh, Bridgewater; Wayne A. Mitchell, Bound Brook, both of N.J.

[73] Assignee: Hoechst Celanese Corporation, Somerville, N.J.

[21] Appl. No.: 14,968

[22] Filed: Feb. 17, 1987

[51] Int. Cl.[4] .................................... G03F 7/00

[52] U.S. Cl. .................................... 430/309; 430/331; 524/320

[58] Field of Search .................... 524/320; 430/309, 331

[56] References Cited

U.S. PATENT DOCUMENTS

| | | | |
|---|---|---|---|
| 3,166,421 | 1/1965 | Gramlich | 430/302 |
| 3,998,783 | 12/1976 | Whelan, Jr. | 524/320 |
| 4,033,919 | 7/1977 | Lawson | 524/555 |
| 4,193,800 | 3/1980 | Iwama et al. | 526/305 |
| 4,308,340 | 12/1981 | Walls | 430/331 |
| 4,329,422 | 5/1982 | Langlais | 430/331 |
| 4,349,391 | 9/1982 | Schell | 148/6.15 R |
| 4,370,404 | 1/1983 | Tachikawa et al. | 430/309 |
| 4,530,897 | 7/1985 | Berghaeuser et al. | 430/302 |

*Primary Examiner*—Joseph L. Schofer
*Assistant Examiner*—Angela L. Fugo
*Attorney, Agent, or Firm*—Richard S. Roberts

[57] ABSTRACT

The invention provides an organic solvent free, phosphate free, lithographic desensitizing composition which comprises:

(a) from about 0.1% to about 20.0% by weight of the composition of a copolymer of polymethyl vinyl ether and maleic acid having the formula

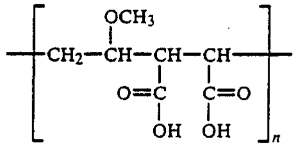

which has a molecular weight in an amount of from about 20,000 to about 70,000; and (b) from about 0.1% to about 20.0% by weight of the composition of a desensitizing component comprising one or more hydroxy carboxylic acids or salts; and (c) sufficient water to formulate a desensitizing composition; and (d) sufficient base to adjust the pH of the composition into the range of from about 6.5 to about 7.5.

10 Claims, No Drawings

DESENSITIZING SOLUTION FOR LITHOGRAPHIC PRINTING PLATES

BACKGROUND OF THE INVENTION

The present invention provides a composition and process for desensitizing lithographic printing plates which have been developed and are ready for printing. In particular, the invention provides a neutral pH, organic solvent free, phosphate free desensitizing solution which renders the non-image areas of imagewise exposed and developed plates permanently hydrophilic.

It is known in the art that it is beneficial for lithographic printing plates to be treated with a desensitizing solution after exposure and development. This is particularly advantageous for plates which are to be stored prior to use.

As the treating solution, an aqueous gum arabic solution is very widely used and it is also known to use dextrin solutions.

German Offenlegungsschrift No. 2,659,754 describes the use of aqueous polyvinyl alcohol solutions for the purpose of protecting lithographic printing plates.

U.S. Pat. No. 4,033,919 dicloses combinations of polymers of acrylamide containing containing carboxyl groups with acids, particularly phosphoric acid, which are used as hydrophilizing and desensitizing agents for printing forms.

In addition, the trend in the printing industry has been to produce plate processing compositions such as developers and desensitizers which do not contain ecologically unacceptable organic solvents and phosphates. It is also important that the developer and desensitizer be compatible since typically they are both used sequentially in automatic plate processing equipment to treat exposed printing plates. The desensitizer composition of this invention has been found to be compatible with the aqueous developer filed as U.S. patent application Ser. No. 014,969, on even date herewith and which is incorporated herein by reference.

SUMMARY OF THE INVENTION

The invention provides an organic solvent free, phosphate free, lithographic desensitizing composition which comprises:

(a) from about 0.1% to about 20.0% by weight of the composition of a copolymer of polymethyl vinyl ether and maleic acid having the formula

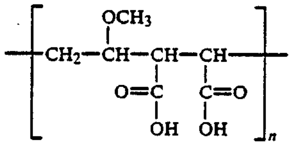

which has a molecular weight in an amount of from about 20,000 to about 70,000; and (b) from about 0.1% to about 20.0% by weight of the composition of a desensitizing component comprising one or more hydroxy carboxylic acids or salts; and (c) sufficient water to formulate a desensitizing composition; and (d) sufficient base to adjust the pH of the composition into the range of from about 6.5 to about 7.5.

The invention further provides a method for treating an imagewise exposed lithographic printing plate which comprises removing the non-image portions of said plate and then contacting said plate with an organic solvent free, phosphate free, lithographic desensitizing composition which comprises:

(a) from about 0.1% to about 20.0% by weight of the composition of a copolymer of polymethyl vinyl ether and maleic acid having the formula

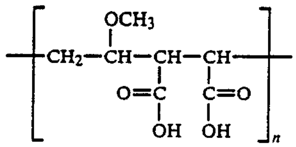

which has a molecular weight in an amount of from about 20,000 to about 70,000; and (b) from about 0.1% to about 20.0% by weight of the composition of a desensitizing component comprising one or more hydroxy carboxylic acids or salts; and (c) sufficient water to formulate a desensitizing composition and (d) sufficient base to adjust the pH of the composition into the range of from about 6.5 to about 7.5.

DETAILED DESCRIPTION OF THE PREFERRED EMBODIMENT

According to the invention, a process for desensitizing lithographic printing plates preferably based on light-hardened diazo compounds, which are ready for printing is provided, in which a lithographic printing plate is treated with the aqueous solution herein.

In the printing plates treated with the solution of the invention, the oleophilic character of the image areas and the hydrophilic character of the background areas are substantially maintained even upon storage and the desensitizing solutions of the invention retain their effectiveness even after they have been stored for a prolonged period of time.

The desensitizing solution may be applied to the surface by rubbing or dabbing on by hand, by immersion into a bath or by means of rollers, spray devices or the like, in a processing machine. Typical application temperatures range from about 60° F. to about 85° F., although this temperature is not critical. After application, the solution is dried.

The support materials used for the printing forms to be treated are generally made of aluminum. These include known support materials with improved surfaces, for example, mechanically, chemically or electrochemically roughened aluminum which optionally have been treated with alkali silicates, polymeric acids or other known agents. The solution of the present invention is particularly suitable for treating printing plates with supports of anodically oxidized aluminum, in which also the oxide layer may have been pretreated with the above-mentioned agents, for example, silicates or polyvinyl phosphonic acid.

The light-sensitive layers used may be those based on diazonium salt condensation products or p-quinone diazides. Suitable materials of this kind are described in the following publications: German Pat. Nos. 1,104,824; 1,134,093; and 1,214,086 and German Offenlegungsschriften Nos. 2,024,244; 2,034,655; and 2,739,774.

The desensitizing composition of this invention comprises a polymeric component which is from about 0.1% to about 20.0% by weight of the composition of a copolymer of methyl vinyl ether and maleic acid having the formula

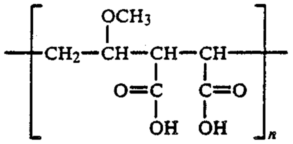

which has a molecular weight in an amount of from about 20,000 to about 70,000. More preferably this component is present in an amount of from about 0.5% to about 10.0% and most preferably from about 1.0% to about 5.0%. Examples of such materials non-exclusively include Gantrez S-95 and AN-119 (after being hydrolyzed in water in the presence of a base) available commercially from GAF.

The composition contains a densensitizing component which comprises from about 0.1% to about 20.0% by weight of the composition, of a densensitizing component comprising one or more hydroxy carboxylic acids or salts. More preferably this component is present in an amount of from about 0.5% to about 10.0% and most preferably from about 1.0% to about 5.0%. Examples of such materials non-exclusively include citric acid, sodium citrate, glycolic acid, tartaric acid, D.L. glyceric acid, malic acid, 4-hydroxy butyric acid, L-tartaric acid and mucic acid.

The composition further comprises sufficient water to formulate the desensitizing composition. This composition then contains sufficient base to adjust the pH of the composition into the range of from about 6.5 to about 7.5, preferably 7.0 to 7.5 and most preferably 7.0 to 7.2. Such may include sodium, lithium and/or potassium hydroxides.

The composition may also optionally contain a minor amount of a dispersing agent. Such non-exclusively include water soluble polyethylene glycols, gylcerin and alkaline metal salts of polymerized alkyl naphthalene sulfonic acids. Examples of the same include Daxad 11KLS available from W. R. Grace and Carbowax PEG 3350 available from Union Carbide. When such a dispersant is employed it is preferably present in an amount of from about 0.1% to about 10% and most preferably from about 0.5% to about 5%.

The following non-limiting examples serve to illustrate the invention.

EXAMPLE 1

Enco® A-30 lithographic printing plates commercially available from American Hoechst Corporation, Somerville, N.J., are imagewise exposed and developed is a known manner. They are then contacted with a densitizing composition having the following formulation:

| | Wt. % |
|---|---|
| Water | 94.12 |
| Gantrez AN-119 | 1.90 |
| NaOH | 0.68 |
| Carbowax PEG 3350 | 1.00 |
| Sodium citrate dihydrate | 1.50 |
| Glycerin | 0.80 |

The plates are then baked at 100° C. for 15 minutes. After the plate is cooled, it is dry-inked with heavy rub-up ink. The ink is then water washed and the plate observed for lithographic properties.

The formulation is tested by various techniques. One is to store finished plates and observe the roll-up. Accelerated tests are performed by baking at 70° C., 100° C., and 120° C. Other plates are stored in the refrigerator and at room temperature. All these plates are tested by:

1. Dry inking and rebaking the plate and rinsing.
2. Dry inking and rinsing immediately.
3. Rinsing the plate, dry ink, then rinse again.
4. Rinse the plate and wet ink.

The efficiency of finishing action, in every case, is tested by several rigorous methods designed to accentuate any inherent weaknesses of the formulation. The final test is to place the treated plates on a printing press and run several thousand acceptable copies. Particular emphasis is placed upon the speed and totality of the image on roll-up.

One method is to process a developed plate with the solution to be tested, either by hand or machine. Half of the plate is dry-inked with any conventional heavy rub-up ink and buffed to a thin film. The other half of the plate is untreated. The entire plate is baked at 100° C. for 15 minutes. After baking and upon the plate being cooled to room temperature, the side that was previously inked is wiped with a damp pad. The untreated side is inked with a damp pad. In both cases, an acceptable desensitizer would prevent any ink from adhering to the background while at the same time not preventing the image from being fully ink receptive. The above tested composition is determined to meet these criteria.

In all cases, after the test, the plate has a clean background and a totally oleophilic image.

EXAMPLE 2

Example 1 is repeated except the following desensitizing composition is employed.

| | Wt. % |
|---|---|
| Water | 95.92 |
| Gantrez S-95 | 1.60 |
| Potassium hydroxide | 0.68 |
| Sodium citrate dihydrate | 1.50 |
| Daxad llKLS | 0.50 |

Similar results are noted.

EXAMPLE 3

Example 1 is repeated except the following desensitizing composition is employed.

| | Wt. % |
|---|---|
| Water | 95.26 |
| Gantrez S-95 | 1.60 |
| Potassium hydroxide | 1.89 |
| Tartaric acid | 0.75 |
| Daxad llKLS | 0.50 |

Similar results are noted.

EXAMPLE 4

Example 1 is repeated except the following desensitizing composition is employed.

| | Wt. % |
|---|---|
| Water | 95.63 |
| Gantrez S-95 | 1.60 |
| Potassium hydroxide | 1.52 |
| Tartaric acid | 0.75 |
| Daxad llKLS | 0.50 |

Similar results are noted.

EXAMPLE 5

Example 1 is repeated except the following desensitizing composition is employed.

| | Wt. % |
|---|---|
| Water | 95.43 |
| Gantrez S-95 | 1.60 |
| Potassium hydroxide | 0.97 |
| Sodium glycolate | 1.50 |
| Daxad llKLS | 0.50 |

Similar results are noted.

EXAMPLE 6

Example 1 is repeated except the following desensitizing composition is employed.

| | Wt. % |
|---|---|
| Water | 95.57 |
| Gantrez S-95 | 1.60 |
| Potassium hydroxide | 0.83 |
| Sodium 4-hydroxybutyric acid | 1.50 |
| Daxad llKLS | 0.50 |

Similar results are noted.

EXAMPLE 7

Example 1 is repeated except the following desensitizing composition is employed

| | Wt. % |
|---|---|
| Water | 95.40 |
| Gantrez S-95 | 1.60 |
| Potassium hydroxide | 1.75 |
| Malic acid | 0.75 |
| Daxad llKLS | 0.50 |

Similar results are noted.

EXAMPLE 8

Example 2 is repeated except a negative working Enco N-25 plate is used. Similar results are noted.

EXAMPLE 9

Example 2 is repeated except a positive working Enco P-800 plate is used. Similar results are noted.

What is claimed is:

1. A method for treating an imagewise exposed lithographic printing plate containing a light sensitive diazo compound which comprises removing the non-image portions of said plate and then contacting said plate with an organic solvent free, phosphate free, lithographic desensitizing composition which comprises:

(a) from about 0.1% to about 20.0% by weight of the composition of a copolymer of polymethyl vinyl ether and maleic acid having the formula

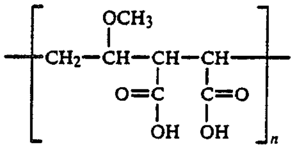

which has a molecular weight in an amount of from about 20,000 to about 70,000; and (b) from about 0.1% to about 20.0% by weight of the composition of a desensitizing component comprising one or more hydroxy carboxylic acids or salts; and (c) sufficient water to formulate a desensitizing composition; and (d) sufficient base to adjust the pH of the composition into the range of from about 6.5 to about 7.5.

2. The method of claim 1 wherein component (b) comprises one or more compounds selected from the group consisting of citric acid, sodium citrate, glycolic acid, tartaric acid, D.L. glyceric acid, malic acid, 4-hydroxy butyric acid, L-tartaric acid and mucic acid.

3. The method of claim 1 wherein said component (d) comprises one or more compounds selected from the group consisting of sodium, lithium and potassium hydroxide.

4. The method of claim 1 further comprising a dispersing agent.

5. The method of claim 4 wherein said dispersing agent comprises one or more compounds selected from the qroup consisting of water soluble polyethylene glycols, glycerin and potassium salts of polymerized alkyl naphthalene sulfonic acids.

6. The method of claim 1 wherein component (a) is present in an amount of from about 0.5% to about 10.0% based on the weight of the desensitizing composition.

7. The method of claim 1 wherein component (b) is present in an amount of from about 0.5% 0.5% to about 10.0% by weight of the composition.

8. The method of claim 1 wherein said composition has a pH in the range of from about 7.0 to about 7.5.

9. The method of claim 4 wherein said dispersing agent is present in an amount of from about 0.1% to about 10.0% based on the weight of the composition.

10. The method of claim 4 wherein said component (a) is present in an amount of from about 1.0% to about 5.0%; and said component (b) is sodium citrate and is present in an amount of from 1.0% to about 5.0%; and component (d) is potassium hydroxide in an amount sufficient to give the desensitizing composition a pH of from about 7.0 to about 7.2; and said dispersing agent is a potassium salt of a polymerized alkyl naphthalene sulfonic acid in an amount of from about 0.5 to about 5.0%, based on the weight of the desensitizing composition.

* * * * *